United States Patent [19]
Lee et al.

[11] Patent Number: 5,268,333
[45] Date of Patent: Dec. 7, 1993

[54] METHOD OF REFLOWING A SEMICONDUCTOR DEVICE

[75] Inventors: Sung-Min Lee; Yoo-suck Jung, both of Seoul, Rep. of Korea

[73] Assignee: Samsung Electronics Co., Ltd., Suweon, Rep. of Korea

[21] Appl. No.: 772,870

[22] Filed: Oct. 8, 1991

[30] Foreign Application Priority Data

Dec. 19, 1990 [KR] Rep. of Korea .................. 90-21056

[51] Int. Cl.⁵ ............................................. H01L 21/02
[52] U.S. Cl. ................................... 437/235; 437/228; 437/236; 437/240; 437/982; 148/DIG. 133
[58] Field of Search ............... 437/235, 236, 982, 240, 437/228; 148/DIG. 133

[56] References Cited

U.S. PATENT DOCUMENTS

| | | |
|---|---|---|
| 4,492,717 | 1/1985 | Pliskin et al. |
| 4,546,016 | 10/1985 | Kern ..................... 437/240 |
| 4,903,117 | 2/1990 | Okamoto et al. |
| 4,948,743 | 8/1990 | Ozaki ..................... 437/982 |
| 5,004,704 | 4/1991 | Maeda et al. ............ 437/240 |
| 5,094,984 | 3/1992 | Liu et al. ................ 437/240 |
| 5,166,101 | 11/1992 | Lee et al. ............... 437/240 |

OTHER PUBLICATIONS

Susa et al., "Borophosphosilicate glass flow in a PH$_3$-O$_2$ ambient", J. Electrochem. Soc., Solid State Science and Technology, vol. 133, No. 7, Jul. 1986, pp. 1517-1518.

Primary Examiner—Brian E. Hearn
Assistant Examiner—Tuan Nguyen
Attorney, Agent, or Firm—Cushman Darby & Cushman

[57] ABSTRACT

A method of reflowing a semiconductor device to increase the planarization thereof includes the steps of first forming a first insulating layer over a silicon semiconductor substrate, forming at least one electrode over the first insulating layer, and then forming a second insulating layer over the at least one electrode and the first insulating layer. A first borophospho silicate glass (BPSG) layer of low concentration is then formed over the resultant surface to a thickness of 6000 to 9000 Å and containing 3-4 wt. % boron and 5-7 wt. % phosphorous. A second borophospho silicate glass (BPSG) layer of high concentration is formed over the resultant surface of the first borophospho silicate glass (BPSG) layer to a thickness of 2000 to 6000 Å and containing 4-7 wt. % boron and 8-10 wt. % phosphorous. This resultant structure is then exposed to a reflowing process so as to flatten the respective surfaces of the first and second borophospho silicate glass (BPSG) layers to form a planarized resultant structure which is then etched. The use of two different concentrations of BPSG films permits lowering baking temperatures during the reflow process by as much as 50° C. while preventing the corrosive forming properties of the resultant reflowed BPSG film.

18 Claims, 3 Drawing Sheets

FIG.1
(PRIOR ART)
FIG.1A
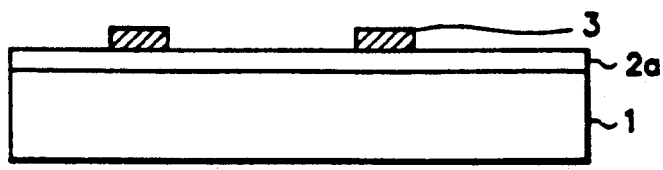
FIG.1B
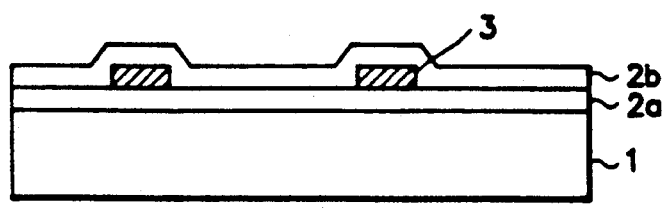
FIG.1C
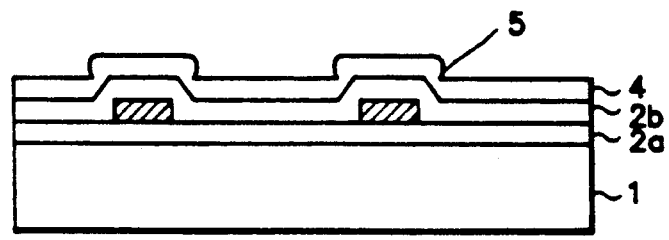
FIG.1D
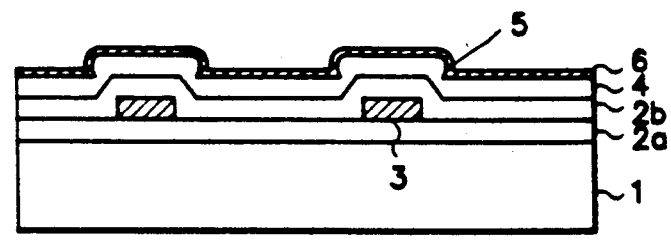
FIG.1E
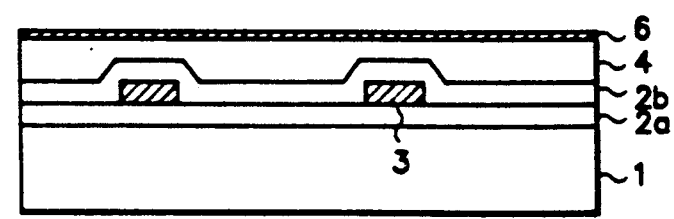
FIG.1F
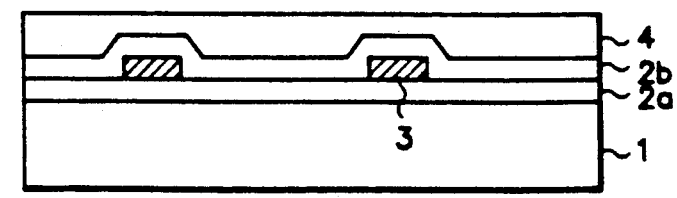

FIG. 4
FIG. 4A
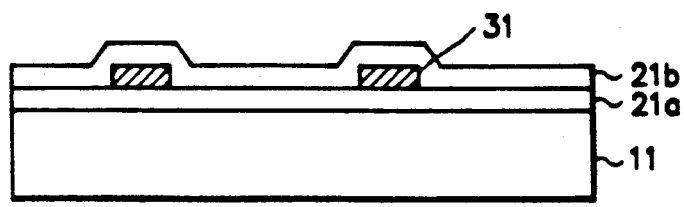
FIG. 4B
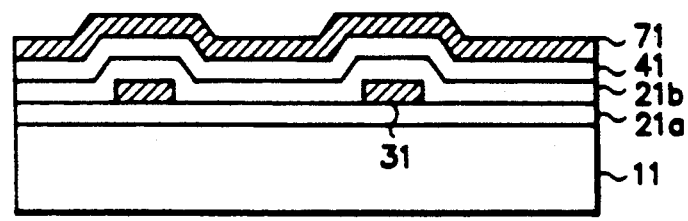
FIG. 4C
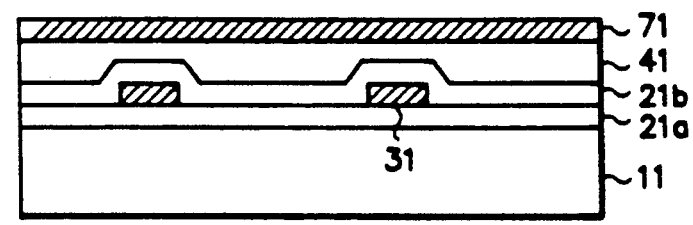
FIG. 4D
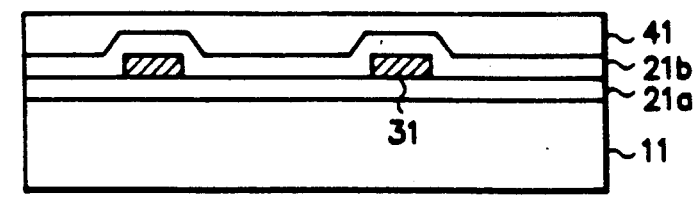

METHOD OF REFLOWING A SEMICONDUCTOR DEVICE

BACKGROUND OF THE INVENTION

1. Field of the Invention

The present invention relates to a method of reflowing a semiconductor device so as to flatten an insulating film between wiring layers in a multilayer wiring process. More particularly, the present invention relates to a method of reflowing a semiconductor device so as to effectively flatten an insulating film using a two layer borophospho silicate glass (BPSG) film, the two layer insulating film being successively deposited between wiring layers using a plasma in an in-situ state.

2. Background Information

Generally, a conventional reflow process comprises the following steps as shown in FIG. 1(A) to (F).

An insulating film $2a$ is formed on a substrate 1 and then an electrode 3 is formed on the insulating film $2a$. Next, an insulating film $2b$ is formed on the insulating film $2a$ and the electrode 3.

A borophospho silicate glass film 4 is deposited over the insulating film $2b$ using a compounded gas formed from sillen ($SiH_4$) gas, a diboron ($B_2H_6$) gas, and a phosphine ($pH_3$) gas in an atmospheric pressure chemical vapor deposition (APCVD) apparatus.

The borophospho silicate glass film 4 comprises a structure containing 3–4wt. % boron and 5–7wt. % phosphorus. The borophospho silicate glass film 4 is simply called a BPSG film hereinafter.

As a result, negative region 5 shown in FIG. 1(C) is formed. Although the BPSG film 4 is reflowed at 900° C., the insulating film cannot be effectively flattened. If the boron and phosphoric concentration of BPSG film 4 is increased, the reflowing temperature of BPSG film 4 decreases.

However, if the boron concentration is increased, surface crystallization of BPSG film 4 results. If the phosphoric concentration is increased, hygroscopicity of BPSG film 4 is strengthened and an acid by-product will form which can corrode adjacent metal wiring layers.

In conventional semiconductor devices using BPSG insulating film, selection of boron and phosphoric concentrations are thus limited and reflow temperatures cannot be successively lowered below 900° C. High reflow temperatures are a great disadvantage.

A conventional reflow process is shown in FIG. 1(A) to (F). After BPSG film 4 has been deposited, a phosphor silicate glass PSG film 6 containing 9 wt. % phosphorus is deposited to a thickness of 1500 to 2000 Å over BPSG film 4, as shown in FIG. 1(D). Subsequently, the semiconductor device is reflowed at 900° C. in a nitrogen gas or "pocl$_3$" environment and PSG film 6 is etched with a diluted fluorine acid ($H_2O$:HF=100:1).

Although negative region 5 disappears and the semiconductor device is made planar, the etching of PSG film 6 results in the high concentration of phosphorus in PSG film 6 diffusing into BPSG film 4 during the reflowing step. As explained above, the high phosphoric concentration results in the corrosion of on-chip metal wiring. Also, the temperature remains relatively high.

Also, as shown in FIG. 3, conventional processes are disadvantageous because a degree $\Theta$ of a flattened insulating film, corresponding to an angle of non-planarization, is a relative high value of 30°–40°.

SUMMARY OF THE INVENTION

The present invention overcomes the above mentioned problems.

An object of the present invention is to provide a method of reflowing a semiconductor device at relatively lower temperatures compared with conventional processes.

An insulating film is flattened by depositing a double layer of borophospho silicate glass (BPSG) film of different boron phosphor concentrations using a cluster type of plasma enhanced chemical vapor deposition (PECVD) apparatus.

To achieve the above object, the present invention comprises a step of forming an insulating film $21a$ on a silicon substrate, forming an electrode 31 in a predetermined area over the insulating film $21a$, forming an insulating film $21b$ on the insulating film $21a$ and the electrode 31, forming a borophospho silicate glass (BPSG) film on the insulating film $21b$, reflowing the BPSG film, and etching the reflowed BPSG film.

BRIEF DESCRIPTION OF THE DRAWINGS

The above object and feature of the present invention will be apparent from the following description of the preferred embodiment with reference to the attached drawings.

FIGS. 1(A) to (C) are section views showing a process for manufacturing a semiconductor device according to the prior art.

FIGS. 1(D) to (F) are section views showing a process for planarizing a semiconductor device according to the prior art.

FIGS. 4(A) to (D) are section views showing a process for manufacturing a semiconductor device according to the present invention.

DETAILED DESCRIPTION OF THE INVENTION

Figure 2:
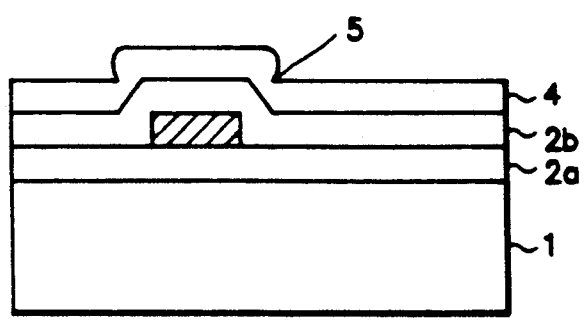
FIG. 2 is an enlarged section view showing a negative region produced according to the prior art.
Figure 3:
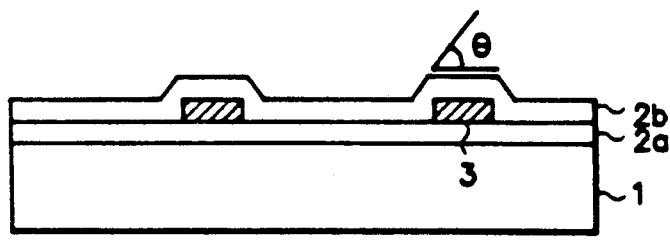
FIG. 3 is a section view describing a degree $\Theta$ of an insulating film flattened with a reflowing process.

FIGS. 4(A) to (D) shows a process for manufacturing a semiconductor device according to the present invention.

As shown in FIG. 4(A), an insulating film $21a$ is formed over a silicon substrate 11, an electrode 31 is formed over the insulating film $21a$, and an insulating film $21b$ is formed over electrode 31 and insulating film $21a$ in a conventional manner.

A tetra ethyl ortho silicate (TEOS) solvent, a trimethyl phosphite (TMP), and a trimethyl borate (TMB) gas are reacted in a plasma state in a cluster type of plasma enhanced vapor deposition apparatus (hereinafter referred to PECVD apparatus). As shown in FIG. 4(B), a low concentration BPSG film 41 containing 3–4 wt. % boron and 5–7 wt. % phosphorus is deposited to a thickness of 7000 to 9000 Å, in an in situ state. A high concentration BPSG film 71 containing 5–7 wt. % boron and 8–10 wt. % phosphorus is then deposited to a thickness of 2000 to 3000 Å over the low concentration BPSG film 41.

As shown in FIG. 4(C), the deposited BPSG films 41 and 71 are then reflowed in a nitrogen environment within a diffusion furnace at a temperature between 800°-850° C. or in a vapor environment within a diffusion furnace at a temperature between 750°-800° C. for thirty minutes.

The semiconductor device is then anisotropically dry etched using CHF$_3$ 20SCCM and CF$_4$ 20SCCM gas within a cluster type PECVD apparatus, as shown in FIG. 4(D).

The high concentration BPSG film 71 is completely removed in an in situ state, and the low concentration BPSG film 41 having diffused therein a concentration of boron and phosphorus from BPSG film 71, is etched by a thickness of 1500 to 2000 Å.

As a result, the double layer structure of BPSG films 41 and 71 formed from TEOS solvent, TMP and TMB gas can be effectively reflowed with very good planar properties at reflow temperatures which are as much as 50° C. lower than conventional reflow processes.

The double layer structure of high and low concentration BPSG films 41 and 71 are successively deposited in a plasma state using a cluster type PECVD apparatus so that pollution is reduced and reflow temperature is lowered.

In addition, because BPSG films 41 and 71 are deposited in a plasma state, remaining BPSG film 41 does not undergo tractive stress, but a compressive stress instead. Thus, product reliability is further improved.

The reflowing process is performed at 750°-850° C. for thirty minutes in accordance with the selected reflow environment such that a degree $\Theta$ of a flattened insulating film can be attained which is below 10.

After the reflowing process, the high concentration of BPSG film 71 is completely removed and the low concentration of BPSG film 41 is partially removed using an anisotropic dry etching process such that surface crystallization of BPSG film 41 and formation of an acid by-product can be prevented.

We claim:

1. A method of reflowing a semiconductor device comprising the steps of:
   forming a first insulating layer over a semiconductor substrate;
   forming at least one electrode over said first insulating layer;
   forming a second insulating layer over said at least one electrode and said first insulating layer;
   forming a first borophospho silicate glass (BPSG) layer of first concentration over the resultant surface of said second insulating layer, said first concentration being a low concentration containing about 3-4 wt. % boron and about 5-7 wt. % phosphorous;
   forming a second borophospho silicate glass (BPSG) layer of second concentration over the resultant surface of said first borophospho silicate glass (BPSG) layer, said second concentration being a high concentration containing about 4-7 wt. % boron and about 8-10 wt. % phosphorous;
   exposing the resultant structure to a reflowing process so as to flatten the respective surfaces of said first and second borophospho silicate glass (BPSG) layers to form a planarized resultant structure; and
   etching said second borophospho silicate glass (BPSG) layer of said planarized resultant structure to expose the first borophospho silicate glass (BPSG) layer.

2. The method of reflowing a semiconductor device as claimed in claim 1, wherein each of said first and second borophospho silicate glass (BPSG) layers is formed by a plasma enhanced chemical vapor deposition (PECVD) process.

3. The method of reflowing a semiconductor device as claimed in claim 2, wherein each of said first and second borophospho silicate glass (BPSG) layers formed by a plasma enhanced chemical vapor deposition (PECVD) process are successively etched in a cluster type of PECVD apparatus in an in situ state.

4. The method of reflowing a semiconductor device as claimed in claim 3, wherein said semiconductor substrate is formed from silicon.

5. The method of reflowing a semiconductor device as claimed in claim 1, wherein said step of exposing the resultant structure to a reflowing process comprises the step of exposing said resultant structure to one of a nitrogen environment at a temperature of about 800°-850° C. and a vapor environment at a temperature of about 750°-800° C.

6. The method of reflowing a semiconductor device as claimed in claim 5, wherein when exposing said resultant structure to one of a nitrogen environment at a temperature of about 800°-850° C. and a vapor environment at a temperature of about 750°-800° C. for approximately thirty minutes, the planarized resultant structure is flattened to an angle $\Theta$ which is less than about 10°.

7. The method of reflowing a semiconductor device as claimed in claim 6, wherein said first borophospho silicate glass (BPSG) layer is formed to a thickness in a range from about 6000 to 9000 Å.

8. The method of reflowing a semiconductor device as claimed in claim 7, wherein said semiconductor substrate is formed from silicon.

9. The method of reflowing a semiconductor device as claimed in claim 6, wherein said second borophospho silicate glass (BPSG) layer is formed to a thickness in a range from about 2000 to 6000 Å.

10. The method of reflowing a semiconductor device as claimed in claim 9, wherein said semiconductor substrate is formed from silicon.

11. The method of reflowing a semiconductor device as claimed in claim 6, wherein said step of etching includes the step of anisotropically dry etching said second borophospho silicate glass (BPSG) layer down to the surface of said first borophospho silicate glass (BPSG) layer.

12. The method of reflowing a semiconductor device as claimed in claim 11, wherein said step of anisotropically dry etching said second borophospho silicate glass (BPSG) layer down to the surface of said first borophospho silicate glass (BPSG) layer further includes the subsequent step of partially anisotropically dry etching said first borophospho silicate glass (BPSG) layer.

13. The method of reflowing a semiconductor device as claimed in claim 12, wherein said step of partially anisotropically dry etching said first borophospho silicate glass (BPSG) layer includes the step of etching said first borophospho silicate glass (BPSG) layer by a thickness of about 1500 to 2000 Å.

14. The method of reflowing a semiconductor device as claimed in claim 13, wherein said semiconductor substrate is formed from silicon.

15. The method of reflowing a semiconductor device as claimed in claim 12, wherein said semiconductor substrate is formed from silicon.

16. The method of reflowing a semiconductor device as claimed in claim 5, wherein said semiconductor substrate is formed from silicon.

17. The method of reflowing a semiconductor device as claimed in claim 1, wherein said semiconductor substrate is formed from silicon.

18. A method of reflowing a semiconductor device comprising the steps of:
  forming a first insulating layer over a silicon semiconductor substrate;
  forming at least one electrode over said first insulating layer;
  forming a second insulating layer over said at least one electrode and said first insulating layer;
  forming a first borophospho silicate glass (BPSG) layer of low concentration over the resultant surface of said second insulating layer to a thickness in a range from about 6000 to 9000 Å, said low concentration containing about 3-4 wt. % boron and about 5-7 wt. % phosphorous;
  forming a second borophospho silicate glass (BPSG) layer of high concentration over the resultant surface of said first borophospho silicate glass (BPSG) layer to a thickness in a range from about 2000 to 6000 Å, said high concentration containing about 4-7 wt. % boron and about 8-10 wt. % phosphorous;
  exposing the resultant structure to a reflowing process so as to flatten the respective surfaces of said first and second borophospho silicate glass (BPSG) layers to form a planarized resultant structure, said step of exposing the resultant structure to a reflowing process comprising the step of exposing said resultant structure to one of a nitrogen environment at a temperature of about 800°-850° C. and a vapor environment at a temperature of about 750°-800° C. for approximately thirty minutes to flatten the planarized resultant structure to an angle Θ which is less than about 10°; and
  anisotropically dry etching said second borophospho silicate glass (BPSG) layer of said planarized resultant structure down to the surface of said first borophospho silicate glass (BPSG) layer and then partially etching said first borophospho silicate glass (BPSG) layer.

* * * * *